Sept. 25, 1962 J. S. COOK ET AL 3,056,092

LOW NOISE SUPERCONDUCTIVE FERROMAGNETIC PARAMETRIC AMPLIFIER

Filed June 27, 1960 2 Sheets-Sheet 1

INVENTORS J. S. COOK
W. H. LOUISELL

BY David P. Kelley

ATTORNEY

Sept. 25, 1962

J. S. COOK ET AL 3,056,092

LOW NOISE SUPERCONDUCTIVE FERROMAGNETIC PARAMETRIC AMPLIFIER

Filed June 27, 1960

2 Sheets-Sheet 2

INVENTORS J. S. COOK
W. H. LOUISELL
BY David P. Kelley
ATTORNEY

United States Patent Office
3,056,092
Patented Sept. 25, 1962

3,056,092
LOW NOISE SUPERCONDUCTIVE FERROMAGNETIC PARAMETRIC AMPLIFIER

John S. Cook, New Providence, and William H. Louisell, Summit, N.J., assignors to Bell Telephone Laboratories, Incorporated, New York, N.Y., a corporation of New York Filed June 27, 1960, Ser. No. 39,118
12 Claims. (Cl. 330—56)

This invention relates to high frequency amplifiers and, more particularly, to low noise variable reactance type amplifiers.

With the increasing interest and research in space and satellite communication, there has concurrently developed a need for improved types of amplifiers exhibiting extremely low noise and high gain at microwave frequencies. To meet this need, there have been developed a variety of devices commonly known as parametric or variable reactance amplifiers which, in varying degrees, satisfy the above requirements. Certain ones of these devices utilize electron beams to produce or to exhibit the variable parameter. While these devices produce high gain, an electron beam is inherently noisy, and extraordinary measures to reduce noise are often necessary. Other types of devices utilize semiconductor diodes as a variable capacitance to produce gain. These devices produce reasonably good gain and low noise, and have the added virtue that they can be refrigerated to decrease their resistance, thereby decreasing further both noise and loss. Devices utilizing ferrite material as a variable inductance likewise can be refrigerated to some extent to decrease further the noise and the loss. Ideally, elimination of the resistance altogether would mean elimination of a major source of noise and loss. Unfortunately, with many types of prior art devices, the gain in effectiveness of the material as a variable reactance decreases as the temperature is lowered to the extent that there are practical limits beyond which further reductions in temperature are of little avail.

It is an object of this invention to produce parametric amplification in a device in which the parasitic resistance is a minimum.

This and other objects of the present invention are achieved in a first illustrative embodiment thereof which comprises a coaxial cavity resonator resonant at the R.-F. signal frequency and at an R.-F. pump frequency. Mounted within the resonator and aligned axially thereof is a member of superconducting material which forms the center conductor of the resonator. A D.-C. current source is provided for supplying current to the superconducting member with the result that a circular D.-C. magnetic field surrounds the conductor. Input means are provided for coupling energy from a pump source into the resonator in a coaxial TEM mode and further input means are provided for coupling signal energy into the resonator in a coaxial TEM mode. Preferably the frequency of the pump energy is twice the signal frequency, although other frequency relationships might be used. Amplified energy is extracted from the cavity through the signal input coupler by way of a circulator. The entire assembly, with the exception of the pump and signal sources and the circulator, is housed within a suitable refrigerating means and cooled to a temperature where the member within the resonator is either partially or completely superconducting.

In a second illustrative embodiment of the invention, the superconducting member is biased by means of an axial D.-C. magnetic field instead of a D.-C. source and the signal and pump energy are introduced into the resonator in the coaxial TEM mode and $TE_{011}$ mode respectively.

In still another illustrative embodiment of the invention, the superconducting member is mounted at the apex of a biconical resonator resonant at both pump and signal frequencies and biased by a D.-C. current, and the pump and signal energy are introduced into the resonator in radial TEM modes.

It is one feature of the present invention in several embodiments thereof that the superconducting material be of a type that is ferromagnetic at superconducting temperatures so that, when subjected to properly oriented time varying fields, its internal inductance varies widely.

It is another feature of this invention that a member of superconducting material be used as a variable reactance element while in its superconducting state to produce a high frequency reactance variation of a cavity resonator, thereby giving rise to parametric amplification, while at the same time exhibiting a minimum of loss and noise arising from series or parasitic resistance.

These and other features of the present invention will be more readily apparent from the following detailed description, taken in conjunction with the accompanying drawings, in which.

Figure 1:
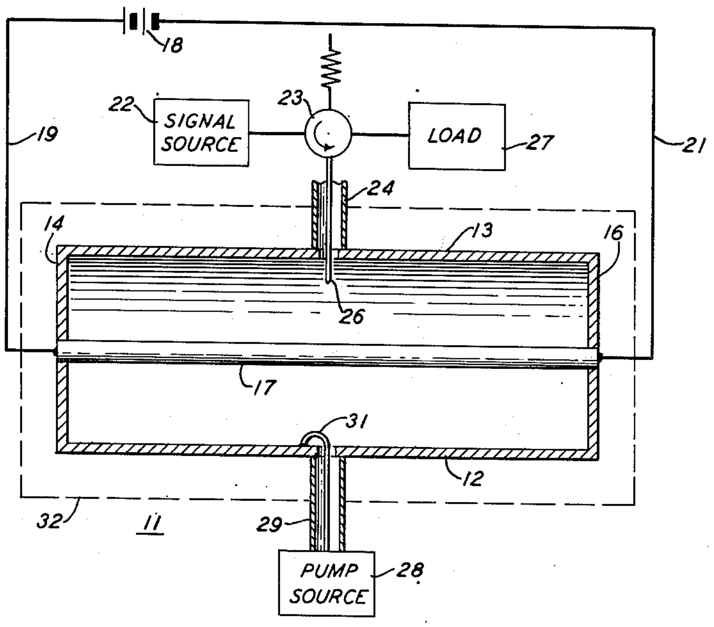
FIG. 1 is a sectional view of one illustrative embodiment of the invention.

Turning now to the drawings, there is shown in FIG. 1 a parametric amplifier 11 which embodies the principles of the present invention. The amplifier 11 comprises a coaxial cavity resonator 12, having its outer wall 13 and end plates 14 and 16 formed of copper or other suitable conducting or superconducting material. The center conductor 17 of the resonator is formed of superconducting material, the properties of which will be discussed more fully hereinafter. The D.-C. voltage source 18 is connected to the two ends of the superconductor 17 through suitable leads 19 and 21, so that a D.-C. current flows in the superconductor 17. A source of signals 22 is connected to the interior of the resonator 12 through a circulator 23, a coaxial lead-in 24 and a probe 26, which excites in the resonator signal energy in the TEM mode. A load or utilization device 27 is likewise connected to circulator 23. Circulator 23 may take any one of a number of forms well known in the art which permits energy to be supplied to resonator 12 and extracted from resonator 12 by probe 26, and directs the energy to the appropriate branch of the circulator depending upon in which branch of the circulator the energy initially appeared. A source of pump energy 28 is connected to the interior of the resonator 12 through a suitable coaxial lead-in 29 and a probe 31, which excites within the resonator 12 pump energy in the TEM mode. Preferably the pump frequency is twice the signal frequency, although this is not necessary. Whatever the frequency relationship, resonator 12 is designed to be resonant at both pump and signal frequencies and also the idler frequency. The resonator 12 is immersed in a suitable refrigerating means 32, shown here for purposes of simplicity in dash outline, and which may take any one of a number of forms well known in the art, such as a cryostat, which is capable of cooling the resonator to and maintaining it at superconducting temperatures.

Figure 1A:
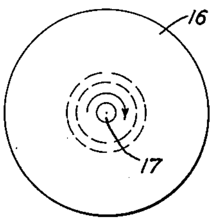
FIG. 1A is a cross sectional view of the device of FIG. 1.

In operation, the D.-C. current passing through the superconductor 17 creates a magnetic field surrounding the superconductor, as designated by the solid arrow in FIG. 1A. Inasmuch as member 17 is a superconductor, whereas the remainder of the resonator is of copper or other suitable conducting material, the two ends of member 17 are not shorted out by the remainder of the resonator. This permits end plates 14 and 16 to be made of superconducting material also, if desired. Pump energy in the TEM mode within the resonator 12 produces a circular magnetic field around superconductor 17, as shown in dashed lines in FIG. 1A, which periodically aids and opposes the D.-C. magnetic field. Under such conditions and as will be explained more fully hereinafter, the inductance of the cavity is varied at the pump rate so that the signal energy within resonator 12 encounters a varying inductance and, in accordance with the well-known principles of parametric amplification, the signal will be amplified. The amplified signal is extracted through probe 26 and directed by circulator 23 to the load 27.

While the device of FIG. 1 is shown as having a superconducting central conductor and a normally conducting outer conductor forming the resonator, it is possible to form the entire resonator of superconducting material. With the TEM mode, the greatest concentration of magnetic field is at the center conductor and there is very little field and hence little loss at the outer wall, thereby permitting copper or other types of normally conducting material to be used. If different resonator or field configurations are used which give rise to appreciable loss at the outer wall, the entire resonator may be made of superconducting material to eliminate substantially completely the losses at the outer wall as well as at the center conductor.

In the foregoing it was stated that the inductance of the cavity was varied at the pump rate. From the following discussion it will readily be seen how this variation in inductance takes place.

When an electromagnetic field is applied to a superconductor, the magnetic field penetrates into the superconductor a distance $\lambda$, which is called the penetration depth. It can be shown that the inductance of the superconductor itself, which shall hereinafter be referred to as the internal inductance, is proportional to the product of the permeability of the superconductor and the penetration depth, that is, $$L_i \propto \mu\lambda \qquad (1)$$

It can be shown that the penetration depth satisfies the relationship $$\lambda = (\lambda_1 - \lambda_0)\left(\frac{H}{H_c}\right)^2 + \lambda_0 \qquad (2)$$

where H is the applied magnetic field, $H_c$ is a critical magnetic field which depends upon the material of the superconductor and is that value of applied magnetic field at which the device ceases to be superconducting, $\lambda_1$ is the penetration depth at the critical field and $\lambda_0$ is the penetration depth at zero applied field. From Equation 2 it can be seen that if the applied field H is varied the penetration depth likewise is varied and, as a consequence from (1), the internal inductance of the superconductor is varied.

In the amplifier 11 of FIG. 1 the field applied to superconductor 17 is made up of a D.-C. component resulting from the D.-C. current passing through the superconductor and an A.-C. component resulting from the applied TEM mode pump wave. As a consequence, since the applied magnetic field varies at the pump rate, $\lambda$ varies at the pump rate and the internal inductance of superconductor 17 likewise varies at the pump rate. Inasmuch as the internal inductance of superconductor 17 forms a portion of the total inductance of the resonator 12, the total inductance of resonator 12 varies at the pump rate, which is a condition giving rise to parametric amplification, as is well known.

From (1) it was seen that the inductance is dependent upon penetration depth, from which it follows that a change in inductance is dependent upon a change in penetration depth. This is true regardless of the value of $\mu$, the permeability of the material. However, the effect of the change in inductance can be magnified by an increase in $\mu$. Thus, a material which exhibits a high permeability at superconducting temperatures enhances the effect of the change in penetration depth. Typical materials exhibiting high permeability at superconducting temperatures are materials of the type disclosed in Patent Nos. 2,989,480 issued June 20, 1961 and 2,970,961 issued February 7, 1961 to B. T. Matthias. The materials of the earlier application are alloys of $CeRu_2$ and $GdRu_2$ having compositions within the range $(Ce_{.90}Gd_{.10})Ru_2$ and $(Ce_{.97}Gd_{.03})Ru_2$, while the materials of the later application are alloys of $YOs_2$ and $GdOs_2$ having compositions within the range $(Y_{.90}Gd_{.10})Os_2$ and $(Y_{.97}Gd_{.03})Os_2$. Still another material is made from alloys of $ThRu_2$ and $GdRu_2$, a typical material in this group being $(Th_{.925}Gd_{.075})Ru_2$. Such materials not only are ferromagnetic at superconducting temperatures, but they also have values of critical magnetic field which permit reasonably large changes in penetration depth as a result of the relationship shown in Equation 2. Because the material used is superconducting, the losses and noise resulting from the series or parasitic resistance are substantially eliminated, with the net result that exceedingly low noise amplification of signal energy at high frequencies is achieved.

Figures 2, 2A:
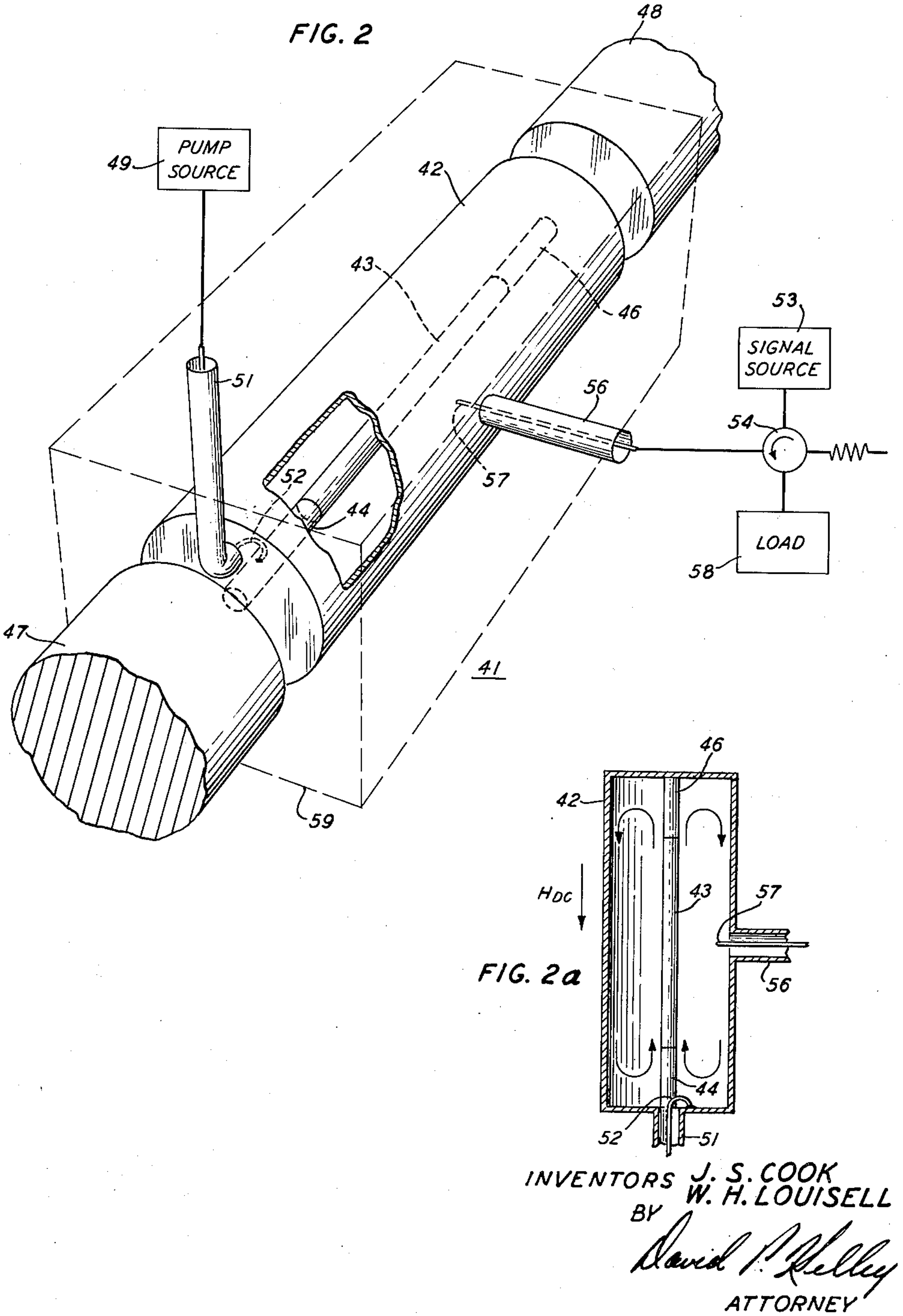
FIG. 2 is a perspective view of another illustrative embodiment of the invention.
FIG. 2A is a sectional plan view of the device of FIG. 2.

In FIG. 2 there is shown a second illustrative embodiment of the present invention. The device of FIG. 2 is an amplifier 41 which comprises a cavity resonator 42 which is resonant at both signal and pump frequencies. Axially disposed within resonator 42 is a member 43 of superconducting material which is mounted between a pair of dielectric rods 44 and 46 which are affixed to the ends of the resonator. Rods 44 and 46 may take any suitable form, that shown here being for purpose of illustration only. An axial magnetic field is created within the resonator 42 by means of a suitable permanent magnet or electromagnet, the pole pieces 47 and 48 of which are shown. A source of R.-F. pump energy 49 is connected to the interior of the resonator 42 through a suitable coaxial cable lead-in 51 and a probe 52, which excites within the resonator 42 pump energy in the $TE_{011}$ mode. A source of signal energy 53 is connected to the interior of resonator 42 through a suitable circulator 54, coaxial cable lead-in 56 and a probe 57, which excites within the resonator signal energy in the TEM coaxial mode. One arm of circulator 54 is connected to a load or utilization device 58. Resonator 42 is immersed within a suitable refrigerating means 59, shown in dashed outline for simplicity, and which, as was the case with the refrigerating means of the device of FIG. 1, may take any one of a number of forms well known in the art capable of maintaining resonator 42 and element 43 at superconducting temperature.

The pump energy in the $TE_{011}$ mode has a magnetic field configuration, as seen in FIG. 2A, which aids and opposes the applied D.-C. magnetic field at the pump frequency rate. As was the case with the device of FIG. 1, the variation in magnetic field applied to the superconductor 43 produces a variation in the penetration depth of the superconductor, as explained heretofore, and, as a consequence, produces a variation in the inductance of the resonator at the pump frequency rate. The applied signal thus encounters a variable reactance and, as a consequence, is amplified in accordance with principles of parametric amplification. The amplified signals are extracted through probe 57, coaxial cable 56, circulator 54 and applied to load 58 in the same manner as was done with the device of FIG. 1.

Figure 3:
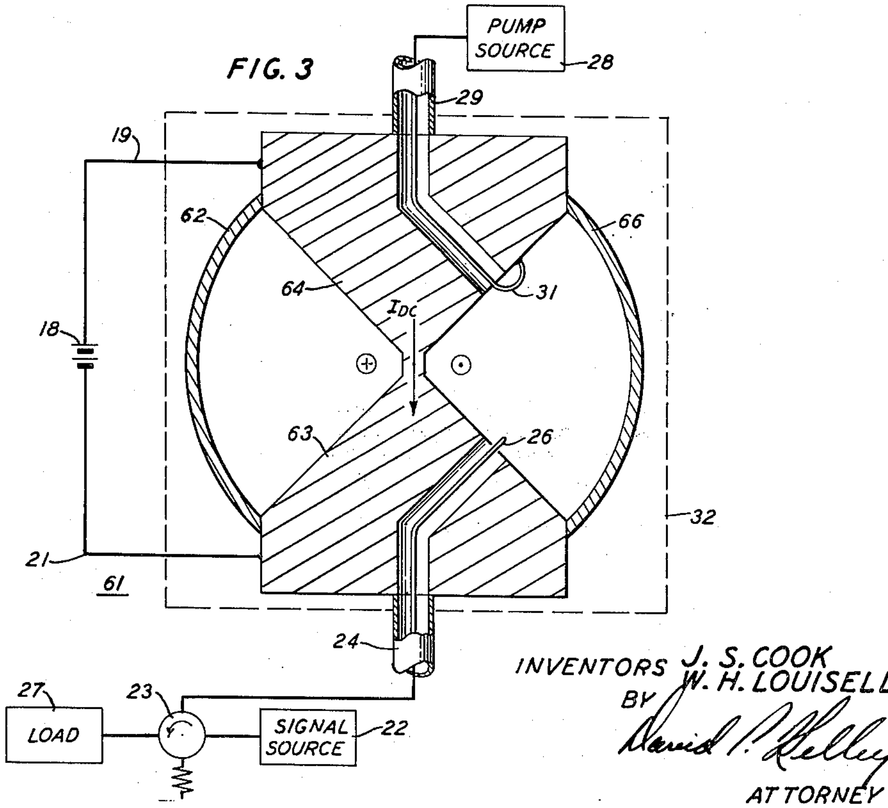
FIG. 3 is a sectional view of still another illustrative embodiment of the invention.

In FIG. 3 there is shown a third illustrative embodiment of the invention, which is equivalent in operation to the device of FIG. 1, but instead of a coaxial cavity resonator, as was the case with the device of FIG. 1, a biconical cavity resonator is utilized. For simplicity, those elements of the device of FIG. 3 which are the same as the corresponding elements of the device of FIG. 1 have been given the same reference numerals. The device of FIG. 3 is an amplifier 61, comprising a biconical cavity resonator 62 in which the cones 63 and 64 are of superconducting material and the wall 66 is of any suitable conducting material, such as copper. A D.-C. voltage source 18 is connected to each of the conical members through suitable leads 19 and 21, so that a D.-C. current passes axially through the conical members, as indicated by the arrow. A source of R.-F. pump energy 28 is connected to the interior of resonator 62 through a suitable coaxial lead-in 29 and a probe 31, which excites within the resonator 62 pump energy in the radial TEM mode. A source 22 of signals to be amplified is connected to the interior of the resonator 62 through a circulator 23, coaxial lead-in 24 and probe 26, which excites within the resonator signal energy in the radial TEM mode. A load or utilization device 27 is connected to one arm of circulator 23. The resonator is immersed in suitable refrigerating means 32 capable of maintaining the device at superconducting temperature.

The operation of the amplifier 61 is substantially identical to the operation of the device of FIG. 1. The D.-C. current flowing through the conical members 63 and 64 creates a circular magnetic field which surrounds the apexes of the cones as indicated by the circled cross and dot. Pump energy in the radial TEM mode likewise produces a circular magnetic field which surrounds the apexes of the cones 63 and 64 aids and opposes the D.-C. magnetic field at the pump frequency rate. Under these conditions, as was the case with the device of FIG. 1, and as explained heretofore, the inductance of the cavity is varied at the pump frequency rate and signal energy in the cavity is accordingly amplified. The amplified signal energy is abstracted through probe 26, cable 24 and directed by circulator 23 to the utilization device 27.

From the foregoing, it can readily be seen that in accordance with the principles of this invention it is possible to achieve exceedingly low noise amplification at very high frequencies with a minimum of complex equipment.

While the principles of the invention have been illustrated in only a few of the possible embodiments, various other embodiments and modifications may occur to workers in the art without departing from the spirit and scope of the present invention.

What is claimed is:

1. In combination, a cavity resonator resonant at a first frequency and a second different frequency, an element of superconducting material mounted within said resonator and extending axially thereof, said element forming a portion of said resonator, said element being characterized by being ferromagnetic at superconducting temperatures and by having a magnetic field penetration depth which varies with variations in a magnetic field applied to said element, means for maintaining said element at superconducting temperature, means for applying a first magnetic field to said element, means for varying the magnetic field penetration depth of said element comprising means for superimposing on said first magnetic field a magnetic field which varies at said first frequency rate, and means for extracting from said resonator radio frequency energy at said second frequency rate.

2. The combination as claimed in claim 1 wherein the means for applying a first magnetic field to said element comprises means for passing a current through said element.

3. The combination as claimed in claim 1 wherein the means for applying a first magnetic field to said element comprises a magnet.

4. A variable inductance type amplifier comprising a resonant circuit resonant at a first frequency and a second different frequency, an element of superconducting material mounted within said resonator and extending axially thereof, said element forming a portion of said resonant circuit, said element being ferromagnetic at superconducting temperatures, means for maintaining said element at superconducting temperature, means for applying a steady state magnetic field to said element, said magnetic field being less than the critical magnetic field of said element, a source of signals at said first frequency to be amplified, means for applying said signals to said resonant circuit, and means for varying the inductance of said element comprising a source of electromagnetic waves at said second frequency, and means for applying said waves to said resonant circuit in a manner such that the magnetic field of said waves alternately aids and opposes said steady state magnetic field.

5. A variable inductance type amplifier as claimed in claim 4 wherein said resonant circuit is a coaxial cavity resonator to which said signals and said waves at said second frequency are applied in the TEM mode.

6. A variable inductance type amplifier as claimed in claim 4 wherein said resonant circuit is a cavity resonator to which said signals and said waves at said second frequency are applied in the TEM and $TE_{011}$ modes, respectively.

7. A variable inductance type amplifier as claimed in claim 4 wherein said resonant circuit is a biconical cavity resonator to which said signals and said waves at said second frequency are applied in the radial TEM mode.

8. A variable inductance type amplifier comprising a cavity resonator resonant at a first frequency and a second, higher frequency, an element of superconducting material mounted within said resonator and extending axially thereof, said element forming a portion of said cavity resonator, said element being characterized by being ferromagnetic at superconducting temperatures and by having a penetration depth which varies with variations in a magnetic field applied to said element with a resultant variation in the inductance of said element, means for maintaining said element at superconducting temperature, means for passing a direct current through said element whereby a magnetic field less than the critical field of said element surrounds said element, a source of signals at said first frequency to be amplified, means for introducing signals from said source into said resonator in the TEM mode, and means for varying the inductance of said element comprising a source of electromagnetic waves at said second frequency and means for introducing said waves into said resonator in the TEM mode whereby the magnetic field of said waves alternately aids and opposes the magnetic field resulting from the said current in said element.

9. In combination, a cavity resonator resonant at a first frequency and a second different frequency, an element of superconducting material within said resonator, said material being characterized by being ferromagnetic at superconducting temperatures, means for maintaining said element at a superconducting temperature, means for applying a first magnetic field to said element, means for varying the inductance of said element comprising means for superimposing on said first magnetic field a magnetic field which varies at said first frequency rate, and means for extracting from said resonator radio frequency energy at said second frequency.

10. The combination as claimed in claim 9 wherein the said element comprises an alloy of $CeRu_2$ and $GdRu_2$ within the range $(Ce_{.90}Gd_{.10})Ru_2$ and $(Ce_{.97}Gd_{.03})Ru_2$.

11. The combination as claimed in claim 9 wherein the said element comprises an alloy of $YOs_2$ and $GdOs_2$ within the range $(Y_{.90}Gd_{.10})Os_2$ and $(Y_{.97}Gd_{.03})Os_2$.

12. The combination as claimed in claim 9 wherein said element comprises an alloy of $ThRu_2$ and $GdRu_2$ within a narrow range which embraces the composition $(Th_{.925}Gd_{.075})Ru_2$.

References Cited in the file of this patent

UNITED STATES PATENTS

| | | |
|---|---|---|
| 2,863,998 | Marie | Dec. 9, 1958 |
| 2,962,585 | Bolef et al. | Nov. 29, 1960 |
| 2,962,676 | Marie | Nov. 29, 1960 |

OTHER REFERENCES

Kingston: "IRE Transactions on Microwave Theory and Techniques," January 1959, pages 92–94.